US009337439B2

(12) United States Patent
Kwon

(10) Patent No.: US 9,337,439 B2
(45) Date of Patent: May 10, 2016

(54) PIXEL, ORGANIC LIGHT EMITTING DISPLAY INCLUDING THE PIXEL, AND METHOD OF DRIVING THE SAME

(71) Applicant: Samsung Display Co., Ltd., Yongin, Gyeonggi-Do (KR)

(72) Inventor: Sun-Ja Kwon, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 26 days.

(21) Appl. No.: 14/043,511

(22) Filed: Oct. 1, 2013

(65) Prior Publication Data

US 2014/0210867 A1 Jul. 31, 2014

(30) Foreign Application Priority Data

Jan. 29, 2013 (KR) ........................ 10-2013-0010000

(51) Int. Cl.
*G09G 3/32* (2006.01)
*H01L 51/52* (2006.01)

(52) U.S. Cl.
CPC .............. *H01L 51/52* (2013.01); *G09G 3/3233* (2013.01); *G09G 3/3258* (2013.01); *G09G 2300/0842* (2013.01); *G09G 2300/0861* (2013.01); *G09G 2300/0876* (2013.01); *G09G 2310/0251* (2013.01); *G09G 2310/0262* (2013.01); *G09G 2320/0233* (2013.01); *G09G 2320/0257* (2013.01); *G09G 2320/045* (2013.01)

(58) Field of Classification Search
CPC ........................................................ G09G 3/32
USPC ........ 345/690, 204, 76, 92, 78, 80; 315/169.3
See application file for complete search history.

(56) References Cited

U.S. PATENT DOCUMENTS

| | | | | |
|---|---|---|---|---|
| 8,138,997 | B2 | 3/2012 | Kim | |
| 8,188,947 | B2 | 5/2012 | Chung | |
| 8,242,980 | B2 | 8/2012 | Choi et al. | |
| 8,242,981 | B2 | 8/2012 | Kim | |
| 8,314,788 | B2 | 11/2012 | Choi | |
| 8,319,708 | B2 | 11/2012 | Yoo et al. | |
| 8,378,931 | B2 | 2/2013 | Kim et al. | |
| 8,379,004 | B2 | 2/2013 | Han et al. | |
| 8,400,377 | B2 | 3/2013 | Hwang | |
| 8,599,114 | B2 * | 12/2013 | Kim et al. | ....................... 345/76 |

(Continued)

FOREIGN PATENT DOCUMENTS

| | | |
|---|---|---|
| KR | 10-2012-0008085 A | 1/2012 |
| KR | 10-2014-0013586 | 2/2014 |

*Primary Examiner* — Olga Merkoulova
(74) *Attorney, Agent, or Firm* — Robert E. Bushnell, Esq.

(57) ABSTRACT

In an organic light emitting display including a pixel, and a method of driving the same, the pixel includes an organic light emitting diode (OLED), a storage capacitor coupled between a first power supply and a first node, a first transistor for controlling a current that flows from the first power supply to a second power supply through the OLED in response to a voltage applied to the first node, a second transistor coupled between a data line and a first electrode of the first transistor and turned on when a control signal is supplied through a control line, a third transistor coupled between the first node and a second electrode of the first transistor and turned on when a scan signal is supplied through an nth (n is a natural number) scan line, and a fourth transistor coupled between an initializing power supply and the first node and turned on when the scan signal is supplied through an (n−1)th scan line.

17 Claims, 4 Drawing Sheets

(56) References Cited

U.S. PATENT DOCUMENTS

| | | | | |
|---|---|---|---|---|
| 8,797,369 | B2 * | 8/2014 | Choi | 345/690 |
| 2005/0243037 | A1 * | 11/2005 | Eom et al. | 345/76 |
| 2010/0253608 | A1 * | 10/2010 | Kim et al. | 345/76 |
| 2012/0001896 | A1 * | 1/2012 | Han et al. | 345/214 |
| 2012/0038683 | A1 | 2/2012 | Park | |
| 2012/0075363 | A1 | 3/2012 | Kim | |
| 2012/0120042 | A1 | 5/2012 | Tsai et al. | |
| 2012/0139957 | A1 | 6/2012 | Choi | |
| 2012/0139961 | A1 | 6/2012 | Choi | |
| 2012/0161611 | A1 | 6/2012 | Ahn | |
| 2012/0212521 | A1 * | 8/2012 | Yamauchi et al. | 345/690 |
| 2013/0002632 | A1 | 1/2013 | Choi | |
| 2014/0028648 | A1 | 1/2014 | Park et al. | |

* cited by examiner

PIXEL, ORGANIC LIGHT EMITTING DISPLAY INCLUDING THE PIXEL, AND METHOD OF DRIVING THE SAME

CROSS-REFERENCE TO RELATED APPLICATION

This application makes reference to, incorporates the same herein, and claims all benefits accruing under 35 U.S.C. §119 from an application earlier filed in the Korean Intellectual Property Office on Jan. 29, 2013 and there duly assigned Serial No. 10-2013-0010000.

BACKGROUND OF THE INVENTION

1. Field of the Invention

The present invention relates to an organic light emitting display, and more particularly, to a pixel capable of displaying an image with uniform brightness, an organic light emitting display including the pixel, and a method of driving the same.

2. Description of the Related Art

Recently, various flat panel displays (FPD) capable of reducing weight and volume that are disadvantages of cathode ray tubes (CRT) have been developed. The FPDs include liquid crystal displays (LCD), field emission displays (FED), plasma display panels (PDP), and organic light emitting displays.

Among the FPDs, the organic light emitting displays display images use organic light emitting diodes (OLED) that generate light by re-combination of electrons and holes. The organic light emitting display has high response speed and is driven with low power consumption.

A conventional organic light emitting display includes a data driver for supplying data signals to data lines, a scan driver for sequentially supplying scan signals to scan lines, a pixel unit including pixels arranged at intersections of the data lines and the scan lines, and a timing controller for controlling operations of the data driver and the scan driver.

When the scan signals are supplied through the scan lines, the pixels charge voltages in correspondence to the data signals supplied through the data lines in storage capacitors included in the pixels and supply currents corresponding to the charged voltages to organic light emitting diodes (OLED) to emit light components with brightness components corresponding to the data signals.

In a conventional pixel, a threshold voltage of a driving transistor is shifted by a voltage applied in a previous frame period. Therefore, when a high voltage is to be charged in a storage capacitor in the previous frame period and a low voltage is to be charged in the storage capacitor in a current frame period, for example, when a white gray scale is to be realized in the current frame period after a black gray scale is realized in the previous frame period, a desired voltage may not be charged in the storage capacitor. That is, the gray scale to be displayed in the current frame period is affected by the gray scale displayed in the previous frame period so that the pixel displays an image with non-uniform brightness. Therefore, an after image may be generated in an image displayed by the pixel unit.

SUMMARY OF THE INVENTION

Accordingly, the present invention has been developed to provide a pixel capable of displaying an image with uniform brightness, an organic light emitting display including the pixel, and a method of driving the same.

In order to achieve the foregoing and/or other aspects of the present invention, there is provided a pixel, including an organic light emitting diode (OLED), a storage capacitor coupled between a first power supply and a first node, a first transistor for controlling a magnitude of a current that flows from the first power supply to a second power supply through the OLED in response to the magnitude of a voltage applied to the first node, a second transistor coupled between a data line and a first electrode of the first transistor and turned on when a control signal is supplied through a control line, a third transistor coupled between the first node and a second electrode of the first transistor and turned on when a scan signal is supplied through an nth (n is a natural number) scan line, and a fourth transistor coupled between an initializing power supply and the first node and turned on when the scan signal is supplied through an (n−1)th scan line.

The pixel may further include a fifth transistor coupled between the first power supply and the first electrode of the first transistor and turned on when an emission control signal is supplied through an emission control line, and a sixth transistor coupled between the second electrode of the first transistor and an anode electrode of the OLED and simultaneously turned on with the fifth transistor.

The pixel may further include a boosting transistor coupled between the nth scan line and the first node.

Each of the third transistor and the fourth transistor may be a dual gate transistor.

The scan signals may be sequentially supplied through the (n−1)th scan line and the nth scan line while the emission control signal is not supplied but the control signal is supplied.

There is provided an organic light emitting display, including a pixel unit which includes pixels arranged at intersections of scan lines, emission control lines, control lines and data lines, a scan driver for sequentially supplying scan signals to the scan lines, for sequentially supplying emission control signals to the emission control lines, and for sequentially supplying control signals to the control lines, and a data driver for supplying data signals to the data lines. A pixel arranged in an nth (n is a natural number) horizontal line includes an OLED, a storage capacitor coupled between a first power supply and a first node, a first transistor for controlling the magnitude of a current that flows from the first power supply to a second power supply through the OLED in response to the magnitude of a voltage applied to the first node, a second transistor coupled between one of the data lines and a first electrode of the first transistor and turned on when a control signal is supplied through an nth control line, a third transistor coupled between the first node and a second electrode of the first transistor and turned on when a scan signal is supplied through an nth scan line, and a fourth transistor coupled between an initializing power supply and the first node and turned on when the scan signal is supplied through an (n−1)th scan line.

Each of the pixels may further include a fifth transistor coupled between the first power supply and the first electrode of the first transistor and turned on when an emission control signal is supplied through an emission control line, and a sixth transistor coupled between the second electrode of the first transistor and an anode electrode of the OLED and simultaneously turned on with the fifth transistor.

Each of the pixels may further include a boosting transistor coupled between the nth scan line and the first node.

Each of the third transistor and the fourth transistor may be a dual gate transistor.

The scan driver may supply the control signal to an nth control line when the emission control signal is not supplied to an nth emission control line.

The scan driver may sequentially supply the scan signals to the (n−1)th scan line and the nth scan line when the control signal is supplied to the nth control line.

There is provided a method of driving a pixel arranged in an nth (n is a natural number) horizontal line, including initializing a driving transistor using a first data signal to be registered in a pixel arranged in an (n−1)th horizontal line in a first period of one horizontal period, and registering a second data signal to be registered in the pixel arranged in the nth horizontal line in a storage capacitor in a second period of the one horizontal period.

Initializing a driving transistor may include applying the first data signal to a first electrode of the driving transistor in the first period and applying an initializing power supply to a gate electrode of the driving transistor in a third period of the first period.

Registering a second data signal in a storage capacitor may include applying the second data signal to the first electrode of the driving transistor in the second period and charging a voltage of a magnitude corresponding to the second data signal in the storage capacitor in a fourth period of the second period.

The method may further include supplying a current of a magnitude corresponding to the magnitude of the voltage charged in the storage capacitor to the OLED after the one horizontal period.

In the pixel according to the present invention, the organic light emitting display including the pixel, and the method of driving the same, an image with uniform brightness may be displayed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
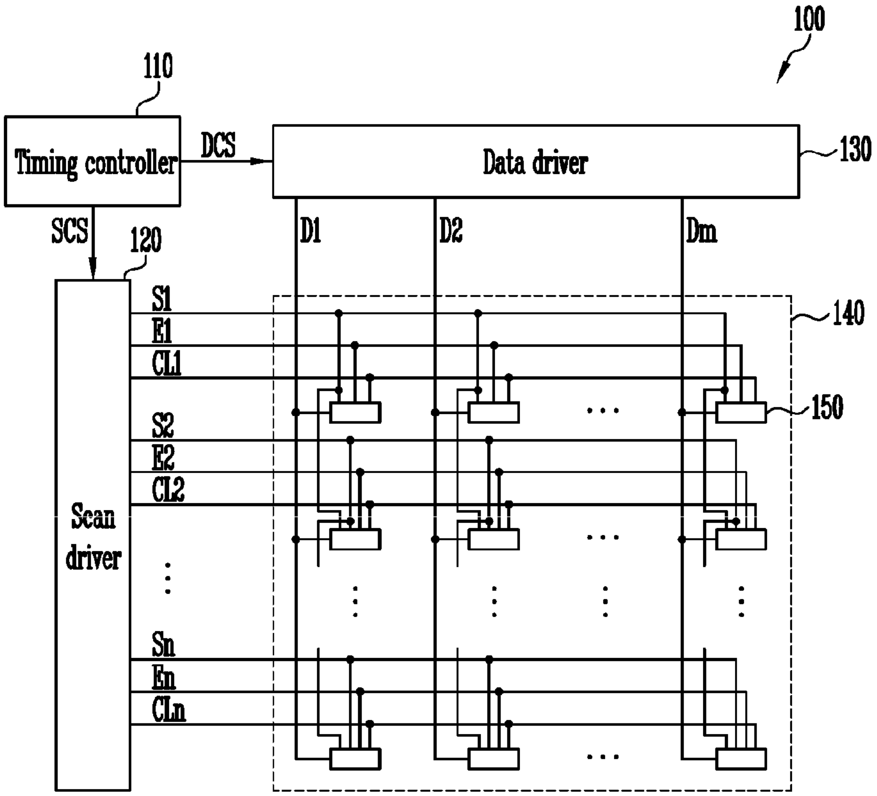
FIG. 1 is a view illustrating an organic light emitting display according to an embodiment of the present invention.

Hereinafter, certain exemplary embodiments according to the present invention will be described with reference to the accompanying drawings. Here, when a first element is described as being coupled to a second element, the first element may be not only directly coupled to the second element but also indirectly coupled to the second element via a third element. Furthermore, some of the elements that are not essential to a complete understanding of the invention are omitted for clarity. Also, like reference numerals refer to like elements throughout.

Hereinafter, exemplary embodiments of the present invention will be described in detail with reference to the accompanying drawings.

Figure 2:
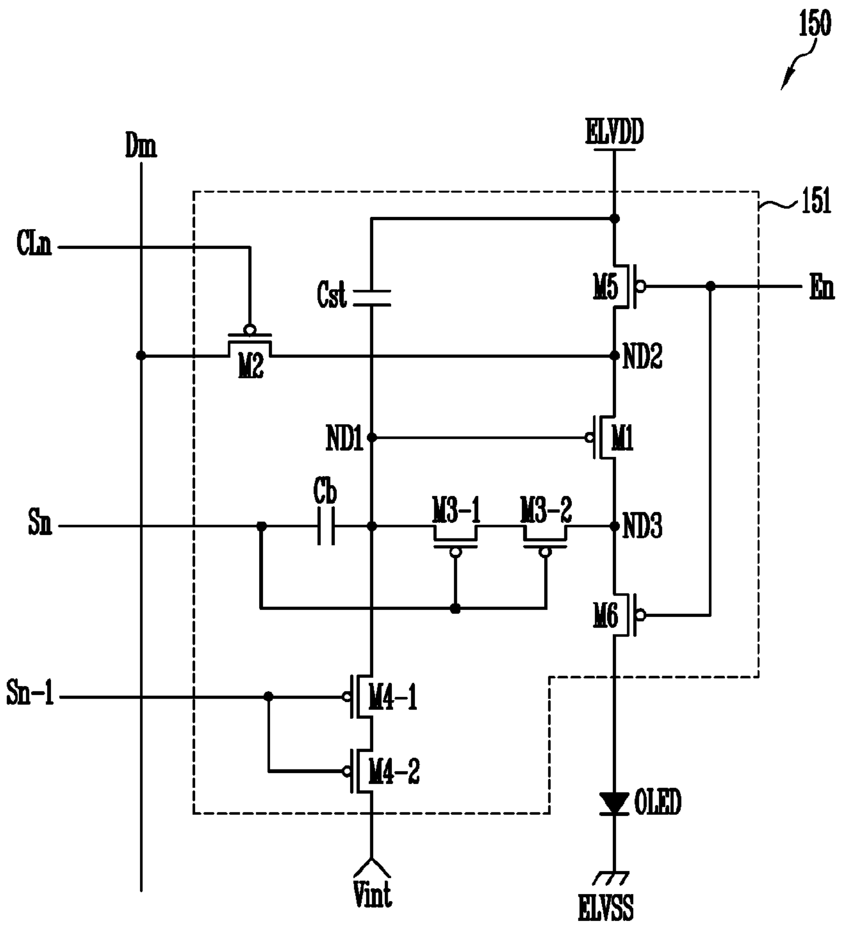
FIG. 2 is a circuit diagram illustrating the pixel of FIG. 1.
Figure 3:
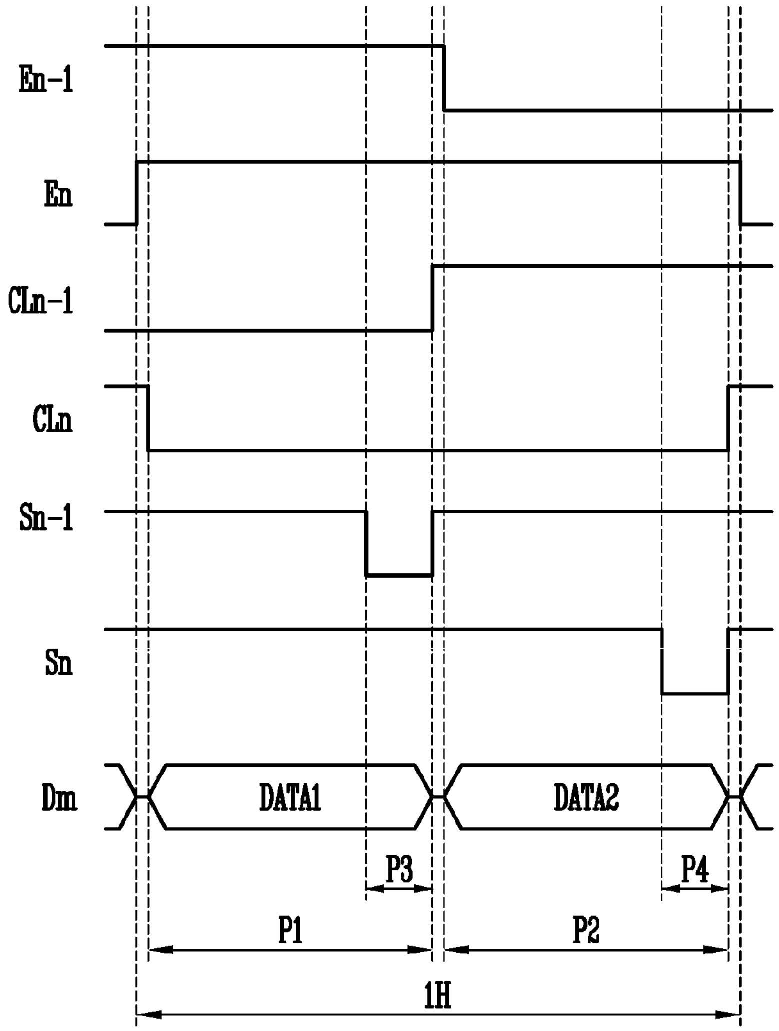
FIG. 3 is a waveform diagram illustrating a method of driving a pixel according to an embodiment of the present invention.

FIG. 1 is a view illustrating an organic light emitting display according to an embodiment of the present invention, FIG. 2 is a circuit diagram illustrating the pixel of FIG. 1, and FIG. 3 is a waveform diagram illustrating a method of driving a pixel according to an embodiment of the present invention. In FIG. 2, for convenience, a pixel 150 arranged in an nth horizontal line is illustrated.

Referring to FIGS. 1 to 3, an organic light emitting display 100 includes a timing controller 110, a scan driver 120, a data driver 130, and a pixel unit 140.

The timing controller 110 controls operations of the scan driver 120 and the data driver 130, and realigns data supplied from the outside so as to supply the realigned data to the data driver 130.

Specifically, the timing controller 110 generates a scan driving control signal SCS in response to a synchronizing signal (not shown) supplied from the outside and outputs the generated scan driving control signal SCS to the scan driver 120. In addition, the timing controller 110 generates a data driving control signal DCS in response to the synchronizing signal, and outputs the generated data driving control signal DCS to the data driver 130 with the realigned data.

The scan driver 120 sequentially outputs scan signals to scan lines S1 to Sn, sequentially outputs emission control signals to emission control lines E1 to En, and sequentially outputs control signals to control lines CL1 to CLn in response to the scan driving control signal SCS outputted from the timing controller 110.

The emission control signals supplied to adjacent horizontal lines overlap each other in a uniform period. For example, the nth control signal outputted to the nth (n is a natural number) emission control line En and the (n−1)th emission control signal output to the (n−1)th emission control line overlap each other in a uniform period.

In addition, control signals supplied to adjacent horizontal lines overlap each other in a uniform period. For example, the nth control signal outputted to the nth control line CLn and the (n−1)th control signal outputted to the (n−1)th control line CLn−1 overlap each other in the uniform period.

The data driver 130 outputs data signals to data lines D1 to Dm in response to the data driving control signal DCS outputted from the timing controller 110. The data driver 130 outputs a first data signal DATA1 to be supplied to pixels arranged in an (n−1)th horizontal line in a first period P1 and outputs a second data signal DATA2 to be supplied to pixels arranged in an nth horizontal line in a second period P2.

The pixel unit 140 includes pixels 150 arranged at intersections of the scan lines S1 to Sn and the data lines D1 to Dm.

The pixels 150 initialize driving transistors included therein using the first data signal DATA1 supplied through the data lines D1 to Dm in the first period P1 and register the second data signal DATA2 supplied through the data lines D1 to Dm in the second period P2 in storage capacitors included in the pixels 150.

The pixel 150 includes an organic light emitting diode (OLED) and a pixel circuit 151 FIG. 2).

The OLED is coupled between the pixel circuit 151 and a second power supply ELVSS. The second power supply ELVSS is set to a lower voltage than a first power supply ELVDD, for example, a ground voltage. The OLED generates light having brightness corresponding to a magnitude of a current supplied by the pixel circuit 151.

The pixel circuit 151 is coupled among the first power supply ELVDD, an initializing power supply Vint, the data line Dm, the scan lines Sn−1 and Sn, the nth emission control line En, the nth control line CLn, and the OLED, and controls a current that flows from the first power supply ELVDD to the second power supply ELVSS through the OLED.

Specifically, the pixel circuit 151 blocks a current that flows to the OLED in response to the nth emission control signal supplied through the nth emission control line En in one horizontal period 1H. Therefore, the OLED does not emit light in the one horizontal period 1H.

The pixel circuit 151 initializes a driving transistor, for example, a first transistor M1 using the first data signal DATA1 in response to the nth control signal supplied through the nth control line CLn and the (n−1)th scan signal supplied through the (n−1)th scan line Sn−1 in the first period P1 of the one horizontal period 1H.

In addition, the pixel circuit 151 registers the second data signal DATA2 in the storage capacitor Cst in response to the nth control signal supplied through the nth control line CLn and the nth scan signal supplied through the nth scan line Sn in the second period P2 of the one horizontal period 1H.

The pixel circuit 151 supplies a current of a magnitude corresponding to a magnitude of a voltage charged in the storage capacitor Cst to the OLED after the one horizontal period 1H. Therefore, the OLED generates light with brightness corresponding to the second data signal DATA2.

The pixel circuit 151 includes transistors M1 to M6 and capacitors Cst and Cb. In FIG. 2, for convenience sake, the transistors M1 to M6 are p-type transistors. However, the present invention is not limited to the above. For example, the transistors M1 to M6 may be realized by n-type transistors. When the transistors M1 to M6 are the n-type transistors, polarities of the waveforms illustrated in FIG. 3 are reversed.

A first electrode of the first transistor M1 is coupled to a second node ND2, a second electrode of the first transistor M1 is coupled to a third node ND3, and a gate electrode of the first transistor M1 is coupled to a first node ND1. The first transistor M1 controls the magnitude of a current that flows from the first power supply ELVDD to the second power supply ELVSS through the OLED. Specifically, the first transistor M1 has current of a magnitude corresponding to the magnitude of the voltage charged in the storage capacitor Cst, the current flowing from the first power supply ELVDD to the second power supply ELVSS through the OLED.

A first electrode of the second transistor M2 is coupled to the mth data line Dm, a second electrode of the second transistor is coupled to the second node ND2, and a gate electrode of the second transistor m2 is coupled to the nth control line CLn. The second transistor M2 supplies the first data signal DATA1 or the second data signal DATA2 supplied through the mth data line Dm to the second node ND2 in response to the nth control signal.

A first electrode of the third transistor M3-1 and M3-2 is coupled to the first node ND1, a second electrode of the third transistor M3-1 and M3-2 is coupled to the third node ND3, and gate electrodes of the third transistor M3-1 and M3-2 are coupled to the nth scan line Sn. The third transistor M3-1 and M3-2 controls coupling between the first node ND1 and the third node ND3 in response to the nth scan signal.

A first electrode of the fourth transistor M4-1 and M4-2 is coupled to the initializing power supply Vint, a second electrode of the fourth transistor M4-1 and M4-2 is coupled to the first node ND1, and gate electrodes of the fourth transistor M4-1 and M4-2 are coupled to the (n−1)th scan line Sn−1. The fourth transistor M4-1 and M4-2 control coupling between the initializing power supply Vint and the first node ND1 in response to the (n−1)th scan signal.

In FIG. 2, each of the third transistor M3-1 and M3-2 and the fourth transistor M4-1 and M4-2 is realized by a dual gate transistor in order to prevent leakage current. However, the present invention is not limited to the above.

A first electrode of the fifth transistor M5 is coupled to the first power supply ELVDD, a second electrode of the fifth transistor M5 is coupled to the second node ND2, and a gate electrode of the fifth transistor M5 is coupled to the nth emission control line En. The fifth transistor M5 controls coupling between the first power supply ELVDD and the second node ND2 in response to the nth emission control signal.

A first electrode of the sixth transistor M6 is coupled to the third node ND3, a second electrode of the sixth transistor M6 is coupled to an anode electrode of the OLED, and a gate electrode of the sixth transistor M6 is coupled to the nth emission control line En. The sixth transistor M6 controls coupling between the third node ND3 and the anode electrode of the OLED in response to the nth emission control signal.

That is, the fifth transistor M5 and the sixth transistor M6 block the current supplied to the OLED in response to the nth emission control signal. Therefore, when the emission control signal is supplied, the OLED does not emit light.

The storage capacitor Cst is coupled between the first power supply ELVDD and the first node ND1. The storage capacitor Cst charges voltages corresponding to the first data signal DATA1 or the second data signal DATA2 and the threshold voltage of the first transistor M1.

The boosting capacitor Cb is coupled between the nth scan line Sn and the first node ND1. The boosting capacitor Cb controls a voltage of the first node ND1 in response to the nth scan signal. The boosting capacitor Cb, used for additionally increasing the voltage of the first node ND1, may be omitted in the designing process.

The nth emission control signal supplied through the nth emission control line is not supplied in the one horizontal period 1H. That is, the nth emission control signal maintains a high level in the one horizontal period 1H. The fifth transistor M5 and the sixth transistor M6 are turned off in the one horizontal period so that the first power supply ELVDD and the second node ND2 are electrically blocked and the third node ND3 and the anode electrode of the OLED are electrically blocked.

The nth control signal supplied through the nth control line CLn is supplied in a uniform period of the one horizontal period 1H. The second transistor M2 is turned on in response to the nth control signal so that the mth data line Dm and the second node ND2 are electrically coupled to each other in a period including the first period P1 and the second period P2 (FIG. 3). Therefore, the first data signal DATA1 is supplied to the second node ND2 in the first period P1 and the second data signal DATA2 is supplied to the second node ND2 in the second period P2.

The (n−1)th scan signal supplied through the (n−1)th scan line Sn−1 is supplied in a third period P3 of the first period P1. The fourth transistor M4-1 and M4-2 is turned on in response to the (n−1)th scan signal so that the initializing power supply Vint and the first node ND1 are electrically coupled to each other in the third period P3. At this time, the initializing power supply Vint is set as a lower voltage than a data signal, for example, the first data signal DATA1 or the second data signal DATA2.

In the third period P3, the initializing power supply Vint is applied to the gate electrode of the first transistor M1 and the first data signal DATA1 is applied to the first electrode of the first transistor M1 so that the first transistor M1 is initialized in an on bias state.

The nth scan signal supplied through the nth scan line is supplied in a fourth period P4 of the second period P2. The third transistor M3-1 and M3-2 is turned on in response to the nth scan signal so that the first node ND1 and the third node ND3 are electrically coupled to each other in the fourth period P4. At this time, the second data signal DATA2 supplied through the data line Dm is applied to the first node ND1 and the storage capacitor Cst charges a voltage corresponding to the voltage applied to the first node ND1.

When supply of the nth scan signal is stopped, the voltage of the first node ND1 is increased by the boosting capacitor Cb. For example, the voltage of the first node ND1 is increased in accordance with an amount of change in the voltage of the nth scan line Sn. As described above, the boosting capacitor Cb increases the voltage of the first node ND1 to compensate for the voltage of the data signal lost by a parasitic capacitor.

After a voltage of a magnitude corresponding to the second data signal DATA2 is charged in the storage capacitor Cst, the nth emission control signal is supplied through the nth emission control line En. The fifth transistor M5 and the sixth transistor M6 are turned on in response to the nth emission control signal so that a current path is formed from the first power supply ELVDD to the second power supply ELVSS through the OLED. At this time, the first transistor M1 controls an amount of current supplied to the OLED so as to correspond to the magnitude of the voltage charged in the storage capacitor Cst.

As described above, the pixel 150 applies the first data signal DATA1 to the first electrode of the first transistor M1 and applies the initializing power supply Vint to the gate electrode of the first transistor M1 in the first period P1 so as to initialize a characteristic curve or a threshold voltage of the first transistor M1 and charges a voltage of a magnitude corresponding to the second data signal DATA2 in the storage capacitor Cst in the second period P2. Therefore, the pixel unit 140 may display a uniform image regardless of the image displayed in the previous frame period.

Figure 4:
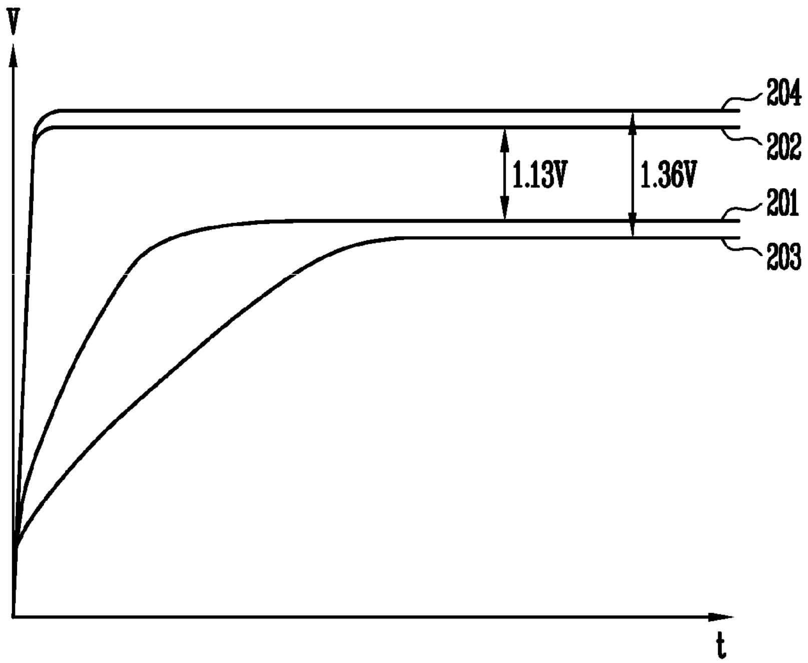
FIG. 4 is a graph illustrating a simulation result of the pixel of FIG. 2.

FIG. 4 is a graph illustrating a simulation result of the pixel of FIG. 2.

A first curve 201 represents a voltage at both ends of the storage capacitor included in the pixel according to the present invention when light is emitted with brightness of 300 [cd/m2] in the previous frame period and is emitted with brightness of 20 [cd/m2] in the current frame period. A second curve 202 represents a voltage at both ends of the storage capacitor included in the pixel according to the present invention when light is emitted with brightness of 0 [cd/m2] in the previous frame period and is emitted with brightness of 20 [cd/m2] in the current frame period.

In addition, a third curve 203 represents a voltage at both ends of a storage capacitor included in a conventional pixel when light is emitted with brightness of 300 [cd/m2] in a previous frame period and is emitted with brightness of 20 [cd/m2] in a current frame period and a fourth curve 204 represents a voltage at both ends of the storage capacitor included in the pixel according to the present invention when light is emitted with brightness of 0 [cd/m2] in the previous frame period and is emitted with brightness of 20 [cd/m2] in the current frame period.

As illustrated in FIG. 4, in the conventional pixel, when the third curve 203 and the fourth curve 204 are saturated, that is, stabilized, a difference between the third curve 203 and the fourth curve 204 is 1.36[V]. On the other hand, in the pixel according to the present invention, when the first curve 201 and the second curve 202 are saturated, a difference between the first curve 201 and the second curve 202 is 1.13[V]. That is, the pixel according to the present invention generates light with uniform brightness in comparison with the conventional pixel.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A pixel, comprising:

an organic light emitting diode (OLED);

a storage capacitor coupled between a first power supply and a first node;

a first transistor for controlling a magnitude of a current that flows from the first power supply to a second power supply through the OLED in response to a magnitude of a voltage applied to the first node;

a second transistor directly coupled between a data line and a first electrode of the first transistor, and turned on when a control signal is supplied through a control line;

a third transistor coupled between the first node and a second electrode of the first transistor, and turned on when a scan signal is supplied through an nth (n is a natural number) scan line; and a fourth transistor coupled between an initializing power supply and the first node, and turned on when the scan signal is supplied through an (n−1)th scan line, wherein a data voltage from the data line is supplied to the first electrode of the first transistor through the second transistor.

2. The pixel as claimed in claim 1, further comprising:

a fifth transistor coupled between the first power supply and the first electrode of the first transistor, and turned on when an emission control signal is supplied through an emission control line; and a sixth transistor coupled between the second electrode of the first transistor and an anode electrode of the OLED, and simultaneously turned on with the fifth transistor.

3. The pixel as claimed in claim 2, wherein the scan signals are sequentially supplied through the (n−1)th scan line and the nth scan line while the emission control signal is not supplied but the control signal is supplied.

4. The pixel as claimed in claim 1, further comprising a boosting capacitor coupled between the nth scan line and the first node.

5. The pixel as claimed in claim 1, wherein each of the third transistor and the fourth transistor is a dual gate transistor.

6. An organic light emitting display, comprising:

a pixel unit including pixels arranged at intersections of scan lines, emission control lines, control lines and data lines;

a scan driver for sequentially supplying scan signals to the scan lines, for sequentially supplying emission control signals to the emission control lines, and for sequentially supplying control signals to the control lines; and a data driver for supplying data signals to the data lines, wherein a pixel arranged in an nth (it is a natural number) horizontal line comprises:

an OLED;

a storage capacitor coupled between a first power supply and a first node;

a first transistor for controlling a magnitude of a current that flows from the first power supply to a second power supply through the OLED in response to a magnitude of a voltage applied to the first node;

a second transistor directly coupled between one of the data lines and a first electrode of the first transistor, and turned on when a control signal is supplied through an nth control line;

a third transistor coupled between the first node and a second electrode of the first transistor, and turned on when a scan signal is supplied through an nth scan line; and a fourth transistor coupled between an initializing power supply and the first node, and turned on when the scan signal is supplied through an (n−1)th scan line, wherein a data voltage from the one of the data lines is supplied to the first electrode of the first transistor through the second transistor.

7. The organic light emitting display as claimed in claim 6, wherein each of the pixels further comprises:

a fifth transistor coupled between the first power supply and the first electrode of the first transistor, and turned on when an emission control signal is supplied through an emission control line; and a sixth transistor coupled between the second electrode of the first transistor and an anode electrode of the OLED, and simultaneously turned on with the fifth transistor.

8. The organic light emitting display as claimed, in claim 6, wherein each of the pixels further comprises a boosting capacitor coupled between the nth scan line and the first node.

9. The organic light emitting display as claimed in claim 6, wherein each of the third transistor and the fourth transistor is a dual gate transistor.

10. The organic light emitting display as claimed, in claim 6, wherein the scan driver supplies the control signal to an nth control line when the emission control signal is not supplied to an nth emission control line.

11. The organic light display as claimed in claim 10, wherein the scan driver sequentially supplies the scan signals to the (n−1)th scan line and the nth scan line when the control signal is supplied to the nth control line.

12. A method of driving a pixel arranged in an nth (n is a natural number) horizontal line, comprising the steps of:

initializing a driving transistor using a first data signal to be registered in a pixel arranged in an (n−1)th horizontal line in a first period of one horizontal period; and registering a second data signal, to be registered in the pixel arranged in the nth horizontal line, in a storage capacitor in a second period of the one horizontal period.

13. The method as claimed in claim 12, wherein the step of initializing the driving transistor comprises:

applying the first data signal to a first electrode of the driving transistor in the first period; and applying an initializing power supply to a gate electrode of the driving transistor in a third period of the first period.

14. The method as claimed in claim 13, wherein the step of registering the e second data signal in the storage capacitor comprises:

applying the second data signal to the first electrode of the driving transistor in the second period; and charging a voltage of a magnitude corresponding to the second data signal in the storage capacitor in a fourth period of the second period.

15. The method as claimed in claim 14, further comprising the step of supplying a current of a magnitude corresponding to the magnitude of the voltage charged in the storage capacitor to the OLED after the one horizontal period.

16. The pixel as claimed in claim 1, wherein the first transistor is initialized using a first data signal to be registered in another pixel arranged in an (n−1)th horizontal line in a first period of one horizontal period, the storage capacitor is charged to a voltage of a magnitude corresponding to a second data signal in a second period of the one horizontal period, and the second data signal is applied to the first electrode in the second period of the one horizontal period.

17. The organic, light emitting display as claimed in claim 6, wherein the first transistor is initialized using a first data signal to be registered in another pixel arranged in an (n−1)th horizontal line in a first period of one horizontal period, the storage capacitor is charged to a voltage of a magnitude corresponding to a second data signal in a second period of the one horizontal period, and the second data signal is applied to the first electrode in the second period of the one horizontal period.

* * * * *